(12) United States Patent
Zhang et al.

(10) Patent No.: US 9,768,807 B2
(45) Date of Patent: Sep. 19, 2017

(54) ON-THE-FLY SYNDROME AND SYNDROME WEIGHT COMPUTATION ARCHITECTURE FOR LDPC DECODING

(71) Applicant: SANDISK TECHNOLOGIES INC., Plano, TX (US)

(72) Inventors: Xinmiao Zhang, Seattle, WA (US); Yuri Ryabinin, Beer Sheva (IL); Eran Sharon, Rishon Lezion (IL)

(73) Assignee: SanDisk Technologies LLC, Plano, TX (US)

( * ) Notice: Subject to any disclaimer, the term of this patent is extended or adjusted under 35 U.S.C. 154(b) by 4 days.

(21) Appl. No.: 14/840,821

(22) Filed: Aug. 31, 2015

(65) Prior Publication Data

US 2017/0063400 A1    Mar. 2, 2017

(51) Int. Cl.
    *H03M 13/15*      (2006.01)
    *G11C 29/52*      (2006.01)
    *H03M 13/11*      (2006.01)
    *H03M 13/00*      (2006.01)
    *G06F 11/10*      (2006.01)

(52) U.S. Cl.
    CPC ..... *H03M 13/1575* (2013.01); *G06F 11/1068* (2013.01); *H03M 13/1108* (2013.01); *H03M 13/1128* (2013.01); *H03M 13/658* (2013.01); *G11C 29/52* (2013.01)

(58) Field of Classification Search
    CPC ......... H03M 13/1575; H03M 13/1128; H03M 13/658; G11C 29/52
    See application file for complete search history.

(56) References Cited

U.S. PATENT DOCUMENTS

| | | | |
|---|---|---|---|
| 8,296,637 B1 | 10/2012 | Varnica et al. | |
| 8,347,195 B1 | 1/2013 | Varnica et al. | |
| 8,645,810 B2 | 2/2014 | Sharon et al. | |
| 8,938,660 B1 | 1/2015 | Varnica et al. | |
| 2013/0031447 A1* | 1/2013 | Sharon | H03M 13/1128 714/785 |
| 2015/0026536 A1* | 1/2015 | Hubris | G06F 11/1048 714/758 |

\* cited by examiner

*Primary Examiner* — Joseph D Torres
(74) *Attorney, Agent, or Firm* — Toler Law Group, PC

(57) ABSTRACT

A decoder includes syndrome storage and a first barrel shifter configured to bit-shift hard decision bit data to generate shifted data that is aligned with a set of syndromes from the syndrome storage. The decoder also includes a first syndrome update circuit coupled to the first barrel shifter and configured to process the set of syndromes based on the shifted data to generate an updated version of the set of syndromes. The decoder may also be configured to perform on-the-fly syndrome weight computation.

20 Claims, 6 Drawing Sheets

ON-THE-FLY SYNDROME AND SYNDROME WEIGHT COMPUTATION ARCHITECTURE FOR LDPC DECODING

FIELD OF THE DISCLOSURE

The present disclosure is generally related to low-density parity-check (LDPC) decoders and more particularly to on-the-fly syndrome and syndrome weight computation for LDPC decoders.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, multi-level cell (MLC) flash memory devices provide increased storage density by storing 2 bits per cell, 3 bits per cell, 4 bits per cell, or more. Although increasing the number of bits per cell and reducing device feature dimensions may increase the storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g., "parity bits") that may be stored with the data as an ECC codeword. Conventionally, data may be encoded to generate an ECC codeword, such as a quasi-cyclic low-density parity-check (QC-LDPC) codeword.

Low-density parity-check (LDPC) codes are used in many communication and data storage systems, including flash memory. Decoding of LDPC codes may be performed using an iterative decoding process in which bits of data are adjusted in an attempt to satisfy a number of parity check equations. A syndrome weight (SW) may be used during the iterative decoding process to indicate a number of parity check equations that are unsatisfied in a particular decoding iteration of the iterative decoding process. In some cases, the SW may be used to detect convergence of the iterative decoding process (e.g., so the decoder may be deactivated or so that another decoding process of another received word may be initiated). However, because syndrome weight is typically computed at the end of each decoding iteration, use of the syndrome weight may unnecessarily introduce a delay between decoding processes in some instances (e.g., by waiting until the end of a decoding iteration to detect whether the iterative decoding process has converged).

DETAILED DESCRIPTION

Figure 1:
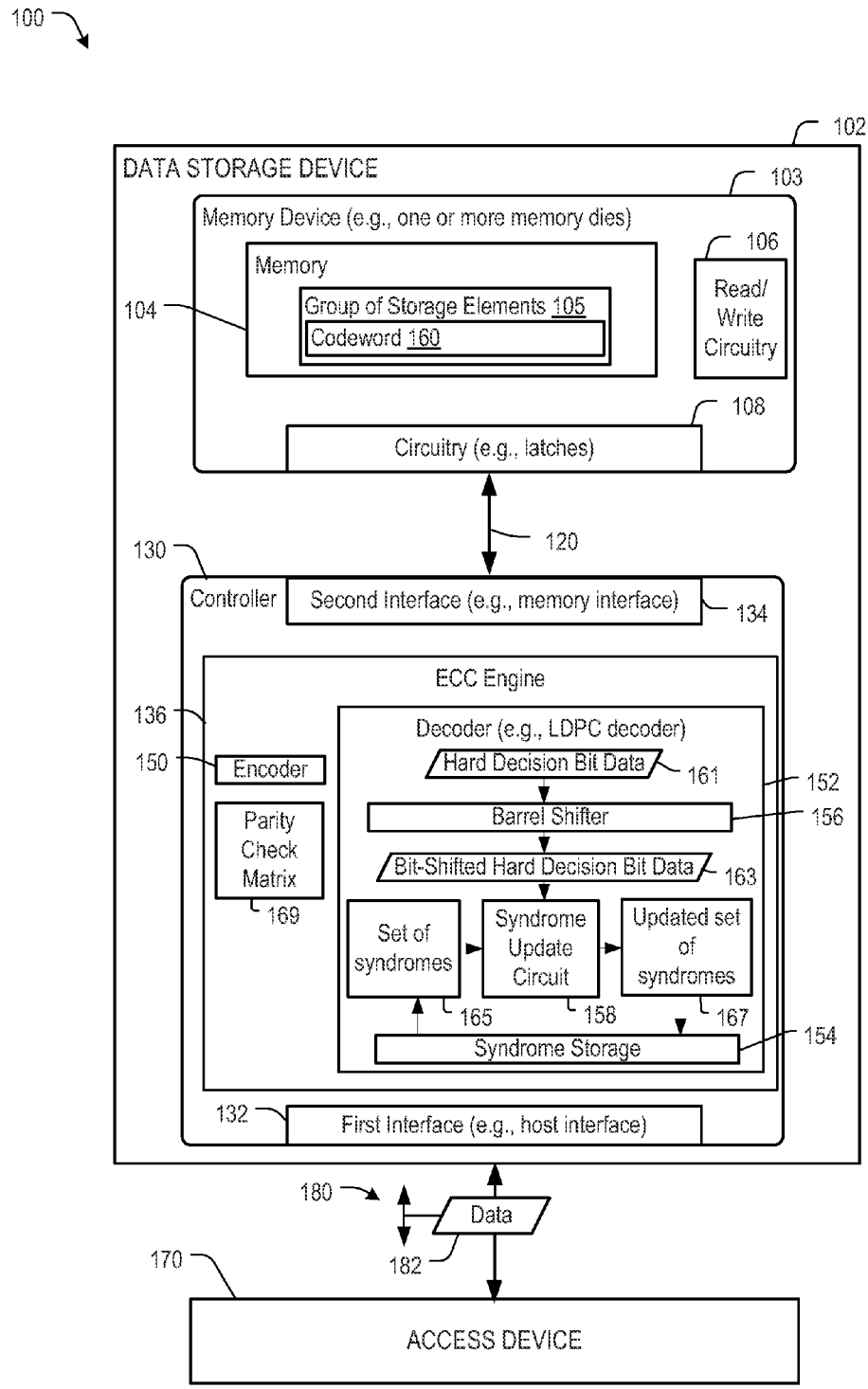
FIG. 1 is a block diagram of a particular illustrative embodiment of a system including a data storage device having decoder that includes a hard decision bit data bit-shifter.

Although certain examples are described herein with reference to a data storage device, it should be appreciated that techniques described herein are applicable to other implementations. For example, information can be received by a communication device (e.g., wirelessly or from a wired network) alternatively or in addition to accessing information from a memory. In this case, error correction coding (ECC) codes, such as low-density parity-check (LDPC) codes, may be utilized to improve reliability of communications (wired or wireless).

Particular examples in accordance with the disclosure are described below with reference to the drawings. In the description, common features are designated by common reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identificatoin and ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

The present disclosure describes an ECC decoder that aligns hard decision bit data with syndromes. As used herein, "hard decision bit data" corresponds to data indicating whether hard decision bits have changed values from a previous decoding iteration. For example, hard decision bit data may be generated by performing an exclusive-OR (XOR) operation on hard decision bits from current and previous decoding iterations. The ECC decoder aligns the hard decision bit data with the syndromes by shifting the hard decision bit data to align with the syndromes rather than by shifting the syndromes to align with the hard decision bit data. Avoiding shifting of syndromes may reduce the complexity of on-the-fly syndrome updating responsive to updates in hard decision bits that participate in the syndromes (e.g., to reduce delay in updating the syndromes and to reduce area used for on-the-fly updating). Syndrome weight computation may also be performed on-the-fly and updated responsive to changes in hard decision bit values to reduce or avoid delay. An on-the-fly syndrome weight computation architecture is described for quasi-cyclic (QC) LDPC codes. As compared to a conventional LDPC decoder that also performs syndrome weight computation on-the-fly, the decoder may include fewer barrel shifters (e.g., one barrel shifter for the hard decision bit data instead of two barrel shifters to shift syndromes and updated syndromes) and may operate using a higher clock frequency (e.g., by reducing a "critical path" that corresponds to an upper limit on clock frequency of the decoder).

FIG. 1 depicts an illustrative example of a system 100 that includes a data storage device 102 and an access device 170 (e.g., a host device or another device). The data storage device 102 includes a controller 130 and a memory device 103 that is coupled to the controller 130. The memory device 103 may include one or more memory dies. The memory device 103 may include circuitry 108 (e.g., one or more latches and/or other circuitry).

The controller 130 includes a decoder 152 having a hardware architecture configured to generate real-time syndromes and syndrome weight on-the-fly. Compared to conventional implementations, the architecture of the decoder 152 of FIG. 1 may include half as many barrel shifters for syndrome computation and may operate using a higher clock frequency.

The data storage device 102 and the access device 170 may be operationally coupled via a connection (e.g., a communication path 180), such as a bus or a wireless connection. The data storage device 102 may include a first interface 132 (e.g., an access device interface) that enables communication via the communication path 180 between the data storage device 102 and the access device 170, such as when the first interface 132 is communicatively coupled to the access device 170.

In some implementations, the data storage device 102 may be embedded within the access device 170, such as in accordance with a Joint Electron Devices Engineering Council (JEDEC) Solid State Technology Association Universal Flash Storage (UFS) configuration. For example, the data storage device 102 may be configured to be coupled to the access device 170 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 170 (i.e., "removably" coupled to the access device 170). As an example, the data storage device 102 may be removably coupled to the access device 170 in accordance with a removable universal serial bus (USB) configuration.

In some implementations, the data storage device 102 may include or correspond to a solid state drive (SSD) which may be included in, or distinct from (and accessible to), the access device 170. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 170 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In some implementations, the data storage device 102 and the access device 170 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples.

The access device 170 may include a memory interface and may be configured to communicate with the data storage device 102 via the memory interface to read data from and write data to the memory device 103 of the data storage device 102. For example, the access device 170 may operate in compliance with a Joint Electron Devices Engineering Council (JEDEC) industry specification, such as a Universal Flash Storage (UFS) Access Controller Interface specification. As other examples, the access device 170 may operate in compliance with one or more other specifications, such as a Secure Digital (SD) Access Controller specification, as an illustrative, non-limiting example. The access device 170 may communicate with the memory device 103 in accordance with any other suitable communication protocol.

The access device 170 may include a processor and a memory. The memory may be configured to store data and/or instructions that may be executable by the processor. The memory may be a single memory or may include multiple memories, such as one or more non-volatile memories, one or more volatile memories, or a combination thereof. The access device 170 may issue one or more commands to the data storage device 102, such as one or more requests to erase data, read data from, or write data to the memory device 103 of the data storage device 102. For example, the access device 170 may be configured to provide data, such as user data 182, to be stored at the memory device 103 or to request data to be read from the memory device 103. The access device 170 may include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, or a resistive memory, such as a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory 104 may include one or more blocks, such as a NAND flash erase group of storage elements. To illustrate, the memory 104 may include a group of storage elements 105 (e.g., also referred to herein as a group of memory cells). The group of storage elements 105 may be configured as a physical page, a word line, or a block, as illustrative, non-limiting examples. Although the memory 104 is depicted as including a single group of storage elements, in other implementations, the memory 104 includes more than one group of storage elements. For example, when the group of storage elements 105 corresponds to a block, the memory 104 may include multiple blocks.

Each storage element of the memory 104 may be programmable to a state (e.g., a threshold voltage in a flash configuration or a resistive state in a resistive memory configuration) that indicates one or more values. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 106, to support operation of one or more memory dies of the memory device 103. Although depicted as a single component, the read/write circuitry 106 may be divided into separate components of the memory device 103, such as read circuitry and write circuitry. The read/write circuitry 106 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The controller 130 is coupled to the memory device 103 via a bus 120, an interface (e.g., interface circuitry, such as a second interface 134), another structure, or a combination thereof. For example, the bus 120 may include one or more channels to enable the controller 130 to communicate with a single memory die of the memory device. As another example, the bus 120 may include multiple distinct channels to enable the controller 130 to communicate with each memory die of the memory device 103 in parallel with, and independently of, communication with other memory dies of the memory device 103.

The controller 130 is configured to receive data and instructions from the access device 170 and to send data to the access device 170. For example, the controller 130 may send data to the access device 170 via the first interface 132, and the controller 130 may receive data from the access device 170 via the first interface 132. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The controller 130 includes an error correction code (ECC) engine 136. The ECC engine 136 may be configured to receive data, such as the user data 182, and to generate one or more ECC codewords (e.g., including a data portion and a parity portion) based on the data. For example, the ECC engine 136 may receive the user data 182 and may generate a codeword 160 to be stored to the group of storage elements 105. To illustrate, the ECC engine 136 may include an encoder 150 configured to encode the data using an ECC encoding technique. The encoder 150 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples. The ECC engine 136 also includes the decoder 152.

The decoder 152 may operate in accordance with an LDPC code that is defined by a sparse parity check matrix H or an associated Tanner graph. Each row of H corresponds to a parity check equation, and each column is associated with a received bit. When H has m rows and n columns (where m and n are integers greater than one), a vector $r=[r_0, r_1, \ldots r_{n-1}]$ is a codeword if and only if r satisfies all check equations, i.e., $rH^T=0$. A row (column) of H is represented by a check (variable) node in the Tanner graph. If the entry of H in the $i^{th}$ row and $j^{th}$ column, $h_{i,j}$, is nonzero, then the corresponding check and variable nodes are connected by an edge in the Tanner graph. In the decoding process, messages regarding the probabilities about the received bits are iteratively computed and passed through the edges in the Tanner graph. During decoding iteration l, a hard decision, $r_j^{(l)}$, is made for variable node j (where j is an integer, $0 \le j < n$) based on reliability messages. The syndromes or check sums $s=[s_0, s_1, \ldots, s_{m-1}]$ may be defined by $s=r^{(l)}H^T$ The syndrome weight is the number of nonzero syndromes. An iterative decoding process performed by the decoder 152 may be terminated when all syndromes are zero or a pre-determined maximum number of iterations, $I_{max}$, has been carried out. If $I_{max}$ iterations have been carried out and at least one syndrome is nonzero, a decoding failure is declared.

The syndromes or syndrome weight can be used to detect decoding convergence at the decoder 152. Moreover, the syndrome weight can be used to adjust the probability messages in order to improve the error-correcting capability of LDPC codes. When the syndrome weight is larger, which means there are many unsatisfied check equations and hence many erroneous bits, the message reliabilities can be tuned down so that the erroneous bits will not contribute too much to the decoding decision. If the syndrome weight continuously decreases for a couple of iterations, then most likely the syndrome weight will keep decreasing until becoming zero in the following iterations. This information can be used to predict the number of remaining iterations and scale down the clock frequency and decoder voltage supply. In all these approaches, the achievable improvement on decoding latency, error-correcting capability and power consumption are dependent on accurate value of the syndrome weight.

Many conventional systems use QC-LDPC codes with partial-parallel decoders. The H matrix of a QC-LDPC code consists of rows and columns of square submatrixes of the same size that are either zero or cyclically shifted identity matrixes. QC-LDPC codes enable more efficient partial-parallel processing and may provide improved throughput and area tradeoffs as compared to serial and fully-parallel schemes. In partial-parallel decoders, the hard decisions of one or more block columns are updated in parallel (e.g., during a clock cycle).

Several methods can be used to compute the syndromes and syndrome weight. When the set of variable nodes connected to a check node c is denoted N(c), the syndrome for check node c may be determined according to Equation 1.

$$s_c = \oplus \Sigma_{j \in N(c)} r_j^{(l)} \quad \text{Eq. 1:}$$

In Equation 1, $\oplus\Sigma$ denotes a sum that is carried out as an exclusive-OR (XOR). If all $r_j^{(l)}$ for $j \in (c)$ are available, a straightforward way to compute $s_c$ is to add up all $r_j^{(l)}$ using an XOR tree. In this case, the syndrome $s_c$ gets updated whenever any $r_j^{(l)}$ changes. Moreover, the syndrome weight can be derived by adding up $s_c$ (where c=0, 1, . . . , m-1) using an adder tree and the syndrome weight can be updated in parallel to any change in $r_j^{(l)}$. Nevertheless, this approach would require all hard decisions to be stored in registers and would require large multiplexors to select $r_j^{(l)}$ according to N(c). The large number of registers and multiplexors lead to high hardware complexity, especially when long LDPC codes are used. Also, adding up all $s_c$ (c=0, 1, . . . , m-1) to derive the syndrome weight is expensive to implement when the number of rows in H is not small, which is the case for long LDPC codes even if the code rate is high.

In many partial-parallel decoders, the hard decisions associated with one or a few block columns of H are computed at a time. In this case, the updated hard decisions can be added up iteratively to derive the syndromes. For example, if one updated $r_j^{(l)}$ is available at a time, then the syndrome is set to zero at the beginning of each decoding iteration and computed iteratively along with the hard decision updating, such as illustrated in pseudocode in Table 1, where $r_j^{(0)}$ are the hard decisions from the channel.

TABLE 1 for l = 0, 1, 2, ..., $I_{max}$
$s_c$ = 0
for each j ∈ N(c)
$s_c = s_c \oplus r_j^{(l)}$ According to the iterative process of Table 1, the updated syndromes are derived at the end of each decoding iteration after all related updated hard decisions are added up. A decoding iteration may take t clock cycles to complete. Even if only the hard decisions computed in the first clock cycle are flipped from those in the previous decoding iteration and hence the decoding converges right after the first clock cycle, the updated syndrome and syndrome weight will not be available for another t−1 clock cycles. Similarly, adding up all syndromes to derive the syndrome weight requires a relatively expensive adder tree. Although the iterative XOR of the hard decisions are relatively simple to compute, syndromes (and syndrome weight) that are generated according to Table 1 are outdated except in the last clock cycle of every iteration. Using such syndromes and syndrome weights would cause lag-behind convergence detection and/or inaccurate message tuning and remaining iteration prediction.

As an alternative to generating syndromes according to Table 1, syndromes (and syndrome weight) can be updated along with each hard decision update. In this case, the syndromes are initialized to 0 at the beginning of the decoding and are computed on-the-fly, such as indicated in the pseudocode of Table 2.

TABLE 2

$s_c$ = 0
for l = 0, 1, 2, ..., $I_{max}$
for each j ∈ N(c)
$s_c = s_c \oplus r_j^{(l)} \oplus r_j^{(l-1)}$ In the pseudocode of Table 2, each $r_j^{(-1)}$ is set to '0'. Accordingly, starting from the last clock cycle in the first decoding iteration, real-time syndromes are available in every clock cycle. To generate real-time syndrome weight for each clock cycle, the syndrome weight is updated according to the syndrome updates. Assuming that the numbers of syndromes that are flipped from 0 to 1 and 1 to 0 in the current clock cycle as $N_{0 \to 1}$ and $N_{1 \to 0}$, respectively, the syndrome weight can be computed according to Equation 2.

$$SW = SW + N_{0 \to 1} - N_{1 \to 0} \quad \text{Eq. 2}$$

The set of check nodes connected to variable node j may be denoted N(j) and may have a cardinality d, i.e., the number of elements in set N(j)=|N(j)|=d. In other words, variable node j participates in d check equations or syndromes. According to Equation 2, as a result of the updating of the $j^{th}$ hard-decision bit, the SW is updated as in Table 3. In Table 3, the d syndromes that participate in a hard-decision bit are added up to update the syndrome weight.

TABLE 3 if $r_j^{(l)} \oplus r_j^{(l-1)}$ = '1'
   SW = SW + d − 2$\Sigma_{i \in N(j)} s_i$
else
   no change on SW To reduce the complexity of the syndromes and syndrome weight updating when the column weight has a large dynamic range, the syndromes may be stored in a random access memory (RAM). Whenever a hard-decision bit is flipped, a request may be added to a queue. One syndrome associated with the flipped hard decision is read from the RAM at a time to be updated and used in the syndrome weight update. In this case, it takes d clock cycles to finish processing the syndromes and syndrome weight updating associated with a flipped hard decision. Hence, the syndromes and syndrome weight are not real-time when any hard decision is flipped. When the bit error rate of the decoder input is not extremely low, multiple bits may be flipped in an iteration, especially in the first few iterations. As a result, a large buffer may be needed to hold the requests and the actual syndromes and syndrome weight may lag behind the hard-decision flips by f·(d−1) clock cycles when there are flipped bits in f consecutive clock cycles. Although updating one syndrome associated with the flipped hard decision at a time simplifies the storing and routing of syndromes, such pseudo on-the-fly scheme does not generate real-time syndromes and syndrome weight at every clock cycle and requires large buffers for holding the indexes of the flipped bits.

In many practical codes, the column weight is constant or varies little from column to column. Real-time syndromes and syndrome weight can be generated by processing all the d syndromes participating in a flipped hard decision simultaneously. The syndromes would need to be stored in registers and multiplexors would be used to select the syndromes to be processed. In a partial-parallel decoder for QC-LDPC codes, usually the hard decisions for one or a few blocks of Z columns are updated at a time if the dimension of the submatrices in H is Z×Z. Conventionally, multiple Z-input barrel shifters are used to shift the syndromes so that the syndromes are aligned with the hard decisions before the syndromes are updated and the syndrome weights are computed. Multiple additional Z-input barrel shifters are used to "un-shift" the updated syndromes for storage. These barrel shifters can account for a significant part of the on-the-fly syndromes and syndrome weight computation architecture silicon area.

Consider a QC-LDPC code whose H matrix consists of M rows of submatrices of dimension Z×Z, where every column has the same weight and the Z hard-decision bits associated with a block column are updated at a time (e.g., the Z hard decision bits are updated in parallel). Since the nonzero submatrixes in H have different offsets, the syndromes need to be cyclically shifted to be aligned with the hard-decision bits before they are added up. The updated syndromes also need to be reversely shifted before they are stored back to the registers. Such shifting can be implemented by two sets of barrel shifters. For example, if the offset of a submatrix is Z−2, then the nonzero entries in columns 0 through Z−1 are located in rows 2, 3, . . . , Z−1, 0, 1. The syndromes associated with this submatrix may be denoted as $s_0, s_1, s_{Z-1}$. The updated syndromes (denoted with a superscript asterisk "*", e.g., $s_0^*$) may be determined according to Equation 3.

$$[s_2^*, s_3^*, \ldots, s_{Z-1}^*, s_0^*, s_1^*] = [s_2, s_3, \ldots, s_{Z-1}, s_0, s_1] \oplus [r_0^{(l)} \oplus r_0^{(l-1)}, r_1^{(l)} \oplus r_1^{(l-1)}, \ldots, r_{Z-1}^{(l)} \oplus r_{Z-1}^{(l-1)}]$$ Eq. 3

For a code with column weight d, 2d Z-input barrel shifters are needed to shift and reversely shift the syndromes. These shifters can take a large part of the silicon area. As an example, a decoder for an LDPC code with Z=64, M=15, and d=4 may have eight 64-input barrel shifters that account for 30% of the logic area of the syndromes and syndrome weight computation architecture.

The decoder 152 includes syndrome storage 154, one or more barrel shifters including a first barrel shifter 156, and one or more syndrome update circuits including a first syndrome update circuit 158.

During operation, the decoder 152 is configured to perform a decoding operation using codeword data read from the memory 104. For example, the codeword data may include a received word (e.g., a representation of the codeword 160 sensed from the memory 104). As an example, the codeword data may include hard decision bit data 161 representing the codeword 160.

The first barrel shifter 156 is configured to bit-shift the hard decision bit data 161 to generate shifted data 163 (e.g., bit-shifted hard decision bit data) that is aligned with a set of syndromes 165 from the syndrome storage 154. The first syndrome update circuit 158 is coupled to the first barrel shifter 156 and is configured to process the set of syndromes 165 based on the shifted data 163 to generate an updated version of the set of syndromes 167. The decoder 152 may also include a syndrome weight update circuit coupled to the first syndrome update circuit 158, such as described in further detail with respect to FIGS. 4-5.

The first barrel shifter 156 may have an input coupled to a hard decision bit circuit, such as described in further detail with reference to FIG. 2. The first barrel shifter 156 is configured to receive multiple bits of the hard decision bit data 161 and to perform a circular bit-shift of the hard decision bit data 161. The first barrel shifter 156 may be responsive to a control signal that indicates a number of bit positions to bit-shift the hard decision bit data 161 (a "shift amount"). The shift amount may be based on a portion of a parity check matrix (H) 169 and may correspond to an offset of a cyclically shifted identity submatrix of the parity check matrix 169, as described in further detail with regard to FIG. 2. As used herein, "bit-shifting" may refer to changing of bit positions of a set of bits based on a shift amount (e.g., a barrel shift operation performed during a particular clock cycle of the decoder 152). As an example, bit shifting a set of bits using a shift amount of one may include shifting a particular bit from a least significant bit (LSB) position to a most significant bit (MSB) position (or vice versa). In some cases, performing a shift operation may result in no bits being shifted (such as if a set of bits includes all logic "0" bits), or a shift amount may be equal to zero.

The first syndrome update circuit 158 is coupled to an output of the first barrel shifter 156 and is also coupled to an output of the syndrome storage 154. The first syndrome update circuit 158 is configured to perform a bit-wise logical operation (e.g., a bit-wise XOR operation) of the set of syndromes 165 received from the syndrome storage 154 and the shifted data 163 to generate the updated set of syndromes 167. For example, the syndrome update circuit 158 may include multiple XOR circuits (e.g., multiple XOR logic gates circuits) that are each configured to receive one bit of the shifted data 163 and one bit of the set of syndromes 165 and to generate one bit of the updated set of syndromes 167.

The decoder 152 is therefore configured to shift the hard decision bit data 161 instead of shifting the syndromes (e.g., the set of syndromes 165). As an example, for a submatrix with offset Z−2 as described with respect to Equation 3 (e.g., a shift amount of Z−2), the syndrome update circuit 158 may update the syndromes in accordance with Equation 4, where $[s_0^*, s_1^*, \ldots, s_{Z-1}^*]$ corresponds to the updated set of syndromes, $[s_0, s_1, s_2, \ldots, s_{(Z-1)}]$ corresponds to the set of syndromes 165, and $[r_{Z-2}^{(l)} \oplus r_{Z-2}^{(l-1)}, r_{Z-1}^{(l)} \oplus r_{Z-1}^{(l-1)}, r_0^{(l)} \oplus r_0^{(l-1)}), \ldots, r_{Z-3}^{(l-1)}]$ corresponds to the shifted data 163.

$$[s_0^*, s_1^*, \ldots, s_{Z-1}^*] = [s_0, s_1 s_2, \ldots, s_{(Z-1)}] \oplus [r_{Z-2}^{(l)} \oplus r_{Z-2}^{(l-1)}, r_{Z-1}^{(l)} \oplus r_{Z-1}^{(l-1)}, r_0^{(l)} \oplus r_0^{(l-1)}, \ldots, r_{Z-3}^{(l)} \oplus r_{Z-3}^{(l-1)}]$$ Eq. 4

The decoder 152 may perform no bit-shifting on the syndromes after retrieving the set of syndromes 165 from the syndrome storage 154 and may also perform no bit-shifting on the updated syndromes before storing the updated set of syndromes 167 into the syndrome storage 154. Instead, only the XORed hard decisions (the hard decision bit data 161) are bit-shifted. As described further with reference to FIGS. 3-5, for a QC-LDPC code with column weight d, only d barrel shifters are needed to align the XORed hard-decision bits with the syndromes associated with the d nonzero submatrices in a block column of the parity check matrix 169.

The syndrome weight can also be updated even though the syndromes are not bit-shifted. For a code with column weight d, there are d nonzero entries in each column of the parity check matrix 169. A flipped hard decision contributes to the syndrome weight update through the syndromes for the rows with those d nonzero entries. Instead of adding up the contributions of those d syndromes first as in Table 3, the contribution of each individual syndrome can be added up in different orders. Moreover, the weight of every column in a block column of a QC H matrix is the same as the weight of every other column in the block column. Hence, instead of adding d to the syndrome weight for each XORed hard decision that is nonzero, the number of nonzero XORed hard decisions for a block column can be multiplied by d and added to the syndrome weight. According to these analyses, the syndrome weight updating can be carried out according to Table 4. In Table 4, N'(i) is the set of variable nodes that are connected to check node i and whose hard decisions are updated in a particular clock cycle. If one block column of a QC H is processed at a time, then the cardinality of each N'(i) is one. The computations in Table 4 generate the same results as the computations of Table 3. However, in Table 4 the d syndromes participating in each hard-decision bit are not first added up together.

Figure 3:
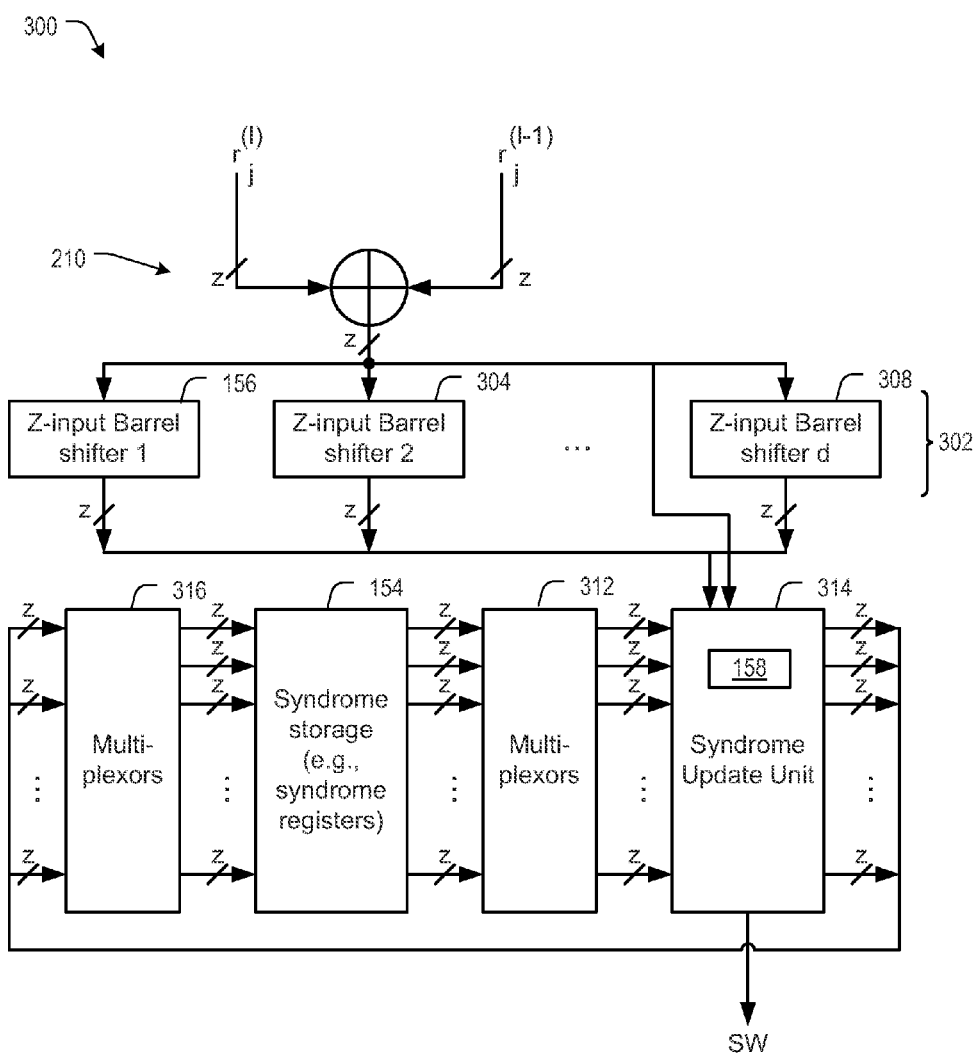
FIG. 3 is a block diagram illustrating a particular embodiment of components that may be included in the decoder of FIG. 1.
Figure 4:
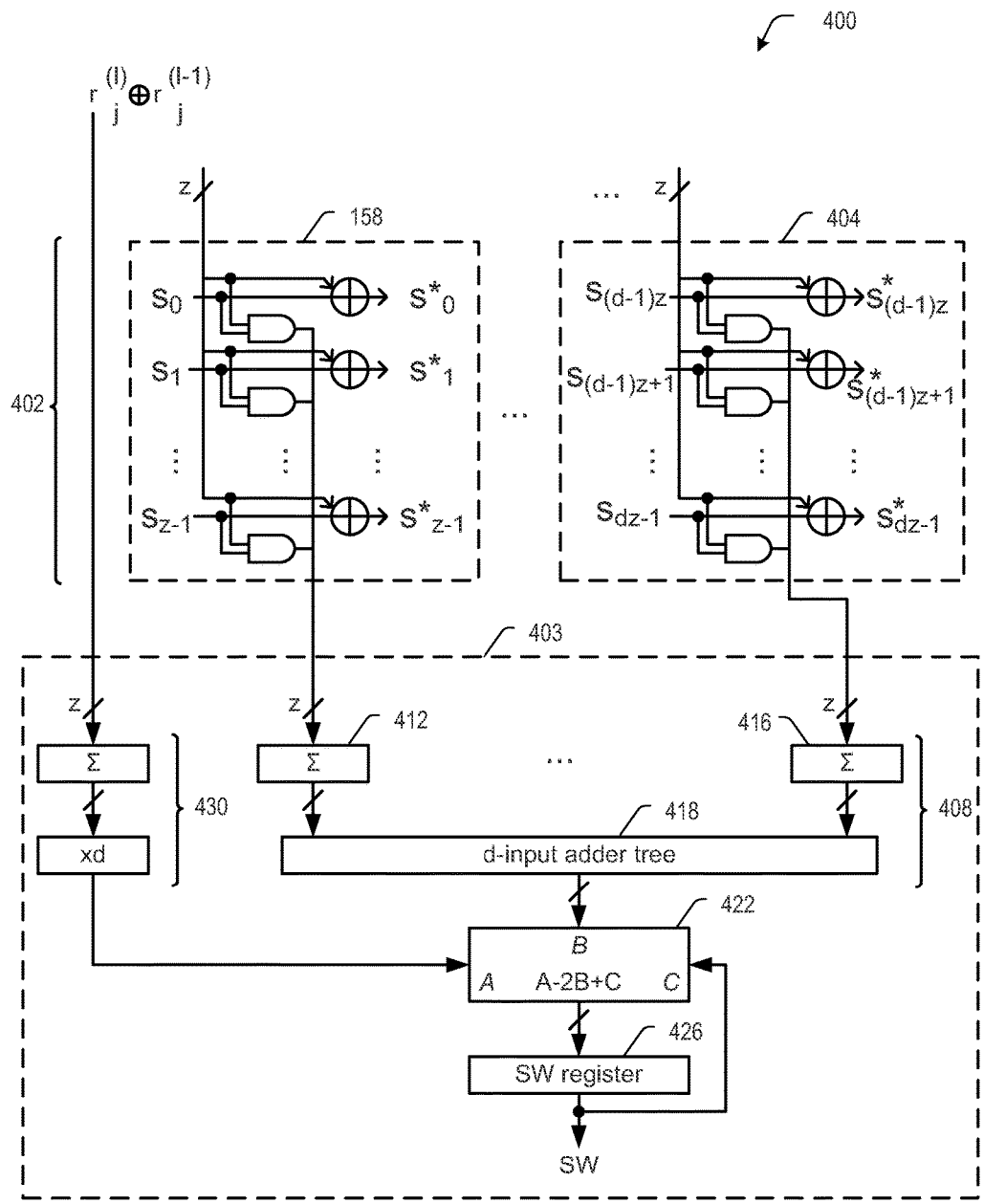
FIG. 4 is a diagram illustrating an embodiment of components that may be included in the components of FIG. 3.
Figure 5:
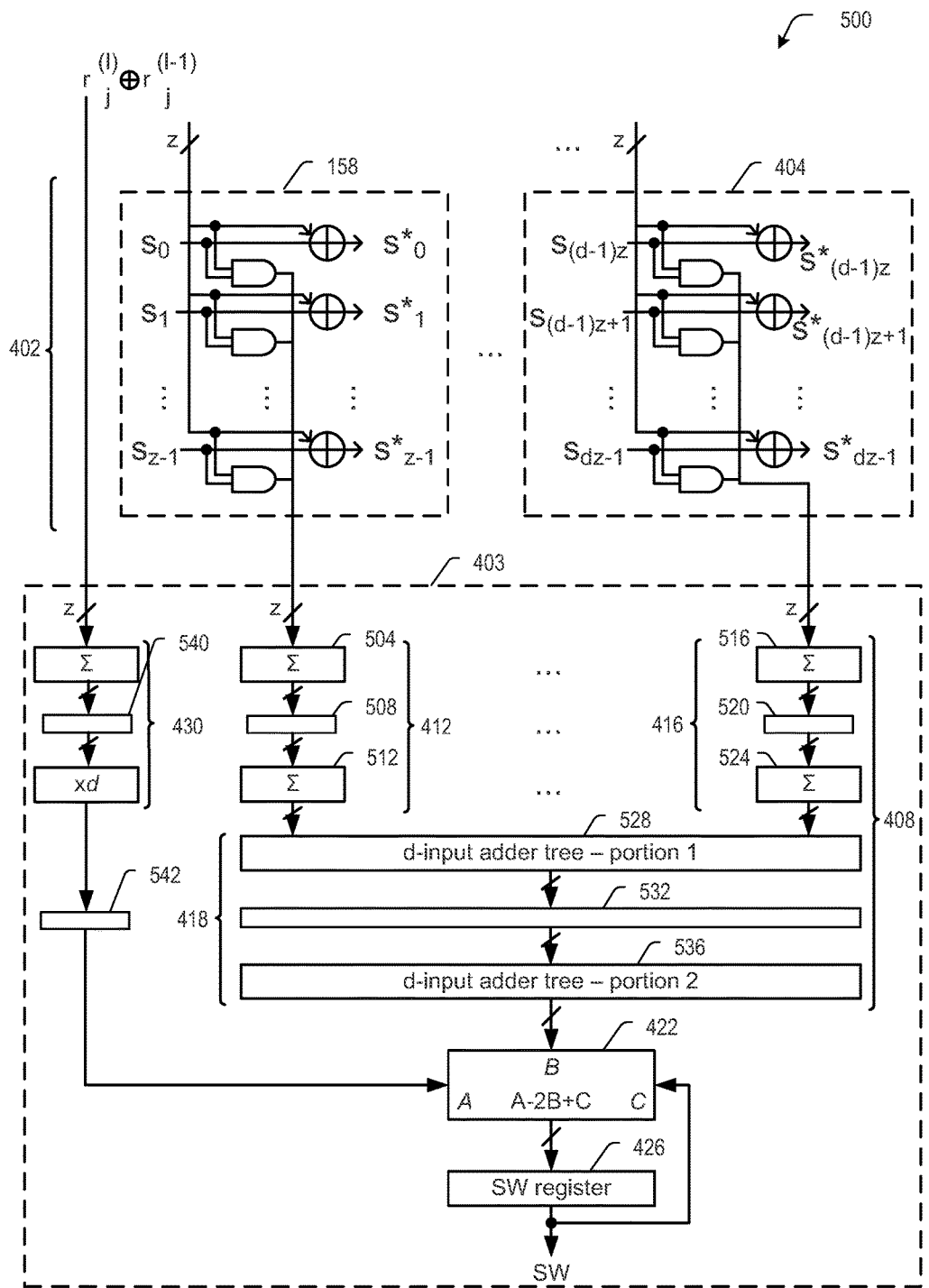
FIG. 5 is a diagram illustrating an embodiment of components that may be included in the components of FIG. 3 and that have a pipelined configuration.

TABLE 4 for every $s_i$ participating in the updated hard-decision bits
count = $\Sigma_i(s_i \Sigma_{j \in N'(i)}(r_j^{(l)} \oplus r_j^{(l-1)}))$
SW = SW + d $\Sigma_j(r_j^{(l)} \oplus r_j^{(l-1)})$ − 2count The decoder 152 may generate modified syndromes and syndrome weight updating according to the scheme of Table 4, as described in further detail with respect to FIGS. 3-5.

Instead of bit-shifting the set of syndromes 165 and reverse bit-shifting the updated set of syndromes 167, the decoder 152 shifts the hard decision bit data 161 (e.g., XORed hard decision bits). As a result, the decoder 152 may include d barrel shifters that use less area as compared to 2d barrel shifters that would be used to bit-shift and reverse bit-shift the syndromes. In addition, a "critical path" may be defined as the longest combinational logic path between any registers in a system and may impose an upper limit on clock frequency. As explained with respect to FIG. 3, a "critical path" of the decoder 152 may be reduced as compared to conventional decoders because the two sets of barrel shifters of conventional decoders are omitted from the data path from an output of the syndrome storage 154 to an input of the syndrome storage 154.

In some implementations, the decoder 152 of FIG. 1 may be configured to operate based on a QC-LDPC code with Z=64, M=15 groups of Z syndromes, and d=4. Such a configuration may utilize less combinational logic area as compared to certain conventional decoders (e.g., as a result of a reduced number of barrel shifters). For the example case of Z=64, M=15, and d=4, a "critical path" of the decoder 152 may be reduced from 4 (multiplexor levels of logic)+6 (barrel shifter levels of logic)+1 (syndrome update level of logic)+6 (barrel shifter levels of logic)+2 (multiplexor levels of logic)=19 levels of logic as in certain conventional decoders to 4 (multiplexor levels of logic)+1 (syndrome update level of logic)+2 (multiplexor levels of logic)=7 levels of logic, which may enable a higher clock frequency of the decoder 152 relative to a conventional decoder.

The on-the-fly syndrome computation architecture illustrated in FIG. 1 generates real-time syndromes and may also generate real-time syndrome weight (e.g., as described with reference to FIG. 4). By reformulating the syndrome updating and the syndrome weight updating as expressed in Equation 4 and Table 4, respectively, the hard-decision bits can be shifted instead of the syndromes. As a result, not only are fewer barrel shifters used as compared to conventional QC LDPC decoders, but also the barrel shifters are also removed from the "critical path." Compared to conventional decoder architectures, the decoder 152 has a smaller area footprint and may operate at a higher clock frequency.

Figure 2:
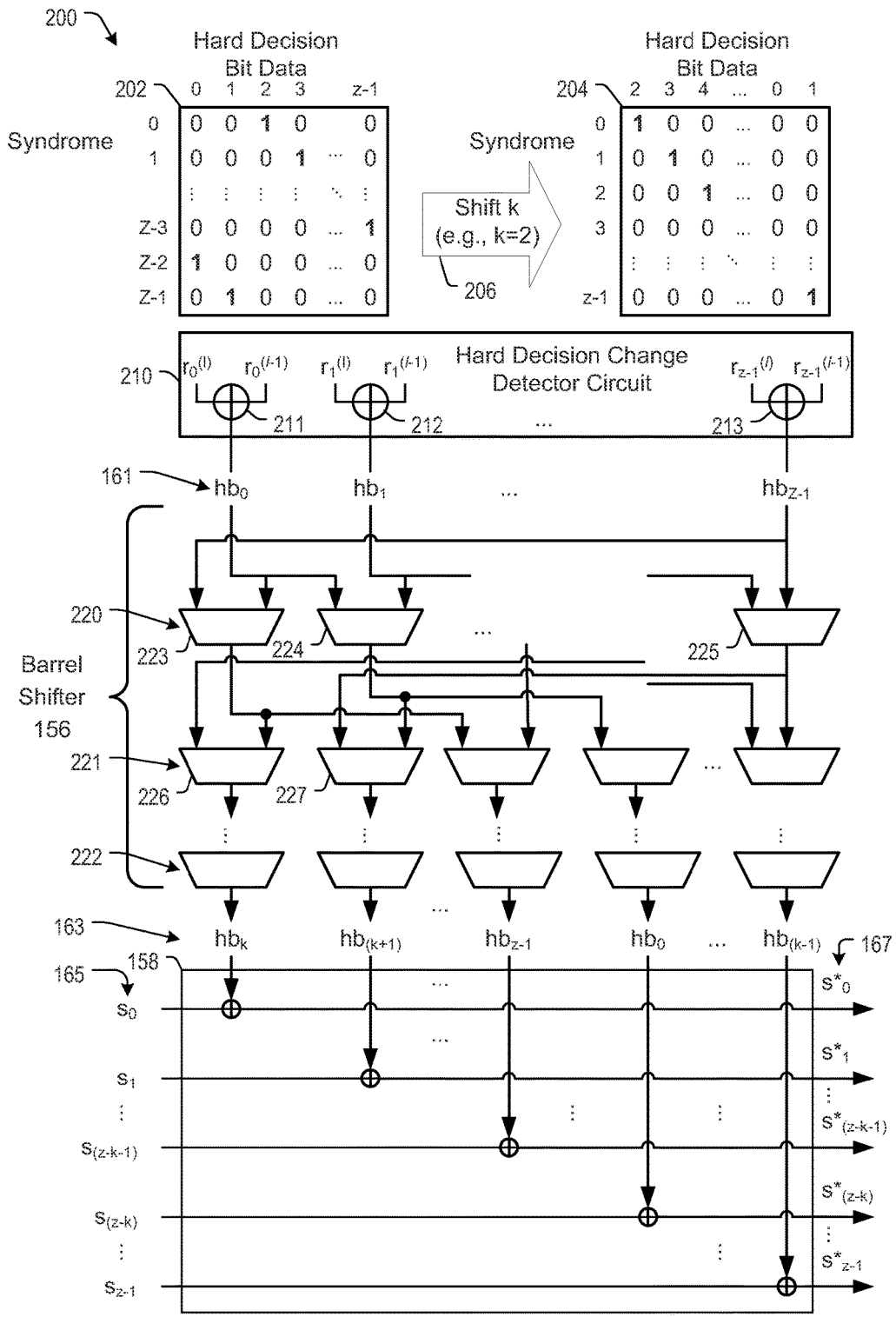
FIG. 2 is a general diagram showing bit-shifting of hard decision bit data to align the hard decision data with syndrome data in the decoder of FIG. 1.

FIG. 2 depicts an illustrative embodiment 200 of components that may be included in the decoder 152 of FIG. 1. The hard decision bit data 161 of FIG. 1 is generated at a hard decision change detector circuit 210 and provided to the first barrel shifter 156 to form the shifted data 163 of FIG. 1. The syndrome update circuit 158 is coupled to an output of the first barrel shifter 156 and to multiple syndrome lines that provide the set of syndromes 165. The syndrome update circuit 158 is configured to generate the updated set of syndromes 167.

A Z×Z submatrix 202 of the parity check matrix 169 of FIG. 1 is depicted as a cyclically shifted version of a Z×Z identity matrix 204. For example, the submatrix 202 may be generated by applying an offset or shift 206 of k bits to each row (or column) of the identity matrix 204. Although k=2 is depicted in FIG. 2, in other examples the matrix may be shifted by any other offset (i.e., k is not limited to 2).

The hard decision change detector circuit 210 includes multiple XOR circuits, such as a first XOR circuit 211, a second XOR circuit 212, up to a $Z^{th}$ XOR circuit 213. The first XOR circuit 211 has a first input coupled to a first bit line that carries a first hard decision bit value of an $l^{th}$ iteration of an iterative decoding operation, denoted $r_0^{(l)}$. The first XOR circuit 211 has a second input coupled to another bit line that carries a first hard decision bit value of the $(l-1)^{th}$ iteration of the decoding operation, denoted $r_0^{(l-1)}$. The first XOR circuit 211 is configured to output a first hard decision bit data value $hb_0$ of the hard decision bit data 161. The first hard decision bit data value $hb_0$ has a value $r_0^{(l)} \oplus r_0^{(l-1)}$. (The symbol "⊕" represents an XOR logic circuit in FIGS. 2-5 and represents an XOR operation in the accompanying description.) The second XOR circuit 212 has inputs coupled to second bit lines that carry a second hard decision bit value $r_1^{(l)}$ of the $l^{th}$ iteration and a second hard decision bit value $r_1^{(l-1)}$ of the $(l-1)^{th}$ iteration. The second XOR circuit 212 is configured to output a second hard decision bit data value $hb_1$ of the hard decision bit data 161. The second hard decision bit data value $hb_1$ has a value $r_1^{(l)} \oplus r_1^{(l-1)}$. The $Z^{th}$ XOR circuit 213 has inputs coupled to $Z^{th}$ bit lines that carry a $Z^{th}$ hard decision bit value $r_{Z-1}^{(l)}$ of the $l^{th}$ iteration and a $Z^{th}$ hard decision bit value $r_{Z-1}^{(l-1)}$ of the $(l-1)^{th}$ iteration. The $Z^{th}$ XOR circuit 213 is configured to output a $Z^{th}$ hard decision bit data value $hb_{Z-1}$ of the hard decision bit data 161. The $Z^{th}$ hard decision bit data value $hb_{Z-1}$ has a value $r_{Z-1}^{(l)} \oplus r_{Z-1}^{(l-1)}$. The outputs of the XOR circuits 211-213 are coupled to inputs of the first barrel shifter 156.

The first barrel shifter 156 is depicted as multiple tiers of Z multiplexors, such as a first tier 220, a second tier 221, and a last tier 222. Although three tiers 220-222 are shown, other implementations may include fewer than three tiers or more than three tiers of multiplexors. Each multiplexor of a particular tier may be configured to select from two inputs to generate an output that represents a first bit shift (e.g., a 1-bit shift) or a second bit shift (e.g., a 0-bit shift) relative to an input of the particular tier. For example, the first tier 220 is configured to generate an output that represents a 1-bit shift or a 0-bit shift of data that is input to the first tier 220. The second tier 221 is configured to generate an output that represents a 2-bit shift or a 0-bit shift of data that is input to the second tier 221. Each of the tiers may be configurable to generate a bit shift amount that is selectable to be a 0-bit shift or a power of two bit shift (e.g., 2, 4, 8, 16, 32, etc.). Each of the tiers may be independently controllable for selection of a combined bit shift of the first barrel shifter 156. For example, sending a first control signal to apply a non-zero shift at the first tier 220 and a second control signal to apply a 0-bit shift at the other tiers 221-222 results in a combined bit shift of 1. As another example, sending a first control signal to apply a non-zero bit shift at the first tier 220 and at the second tier 221 and sending a second control signal to apply a 0-bit shift at the other tiers results in a combined bit shift of 3.

Depending on the value k of the shift 206, multiplexors of the first barrel shifter 156 may be configured to select a first input that corresponds to no bit shift (i.e., a zero shift amount) or to select a second input that corresponds to a bit shift (i.e., a non-zero shift amount). For example, the first tier 220 may include a first multiplexor 223, a second multiplexor 224, up to a $Z^{th}$ multiplexor 225 that may select the first input that corresponds to no bit shift when the first multiplexor 223 selects the first bit $hb_0$, the second multiplexor 224 selects the second bit $hb_1$, the $Z^{th}$ multiplexor 225 selects the $Z^{th}$ bit $hb_{Z-1}$, etc. As another example, the multiplexors 223-225 of the first tier 220 may select the second input that corresponds to a 1-bit circular bit shift when the first multiplexor 223 selects the $Z^{th}$ bit $hb_{Z-1}$, the second multiplexor 224 selects the first bit $hb_0$, the $Z^{th}$ multiplexor 225 selects the $(Z-1)^{th}$ bit $hb_{Z-2}$, etc. Similarly, a first multiplexor 226 of the second tier 221 may be configured to select the output of the first multiplexor 223 or the output of the $(Z-1)^{th}$ multiplexor of the first tier 220. A second multiplexor 227 of the second tier 221 may be configured to select the output of the second multiplexor 224 or the output of the $Z^{th}$ multiplexor 225 of the first tier 220. Outputs of multiplexors of the last tier 222 provide bits of the shifted data 163 at multiple hard decision data bit lines at the output of the first barrel shifter 156.

The first syndrome update circuit 158 includes multiple XOR circuits. Each XOR circuit in the first syndrome update circuit 158 has a first input coupled to one of the hard decision data bit lines that are at the output of the first barrel shifter 156 and has a second input coupled to one of multiple syndrome lines of an output of the syndrome storage 154 of FIG. 1. The output of each XOR circuit in the first syndrome update circuit 158 corresponds to a bit of the updated set of syndromes 167.

During operation, the shift amount k may be determined by the decoder 152 based on which block row and block column of the parity check matrix 169 are being processed at the first barrel shifter 156 and the first syndrome update circuit 158. The decoder 152 may configure the first barrel shifter 156 to apply a bit shift that matches the shift amount k. Note that multiple block rows having the same or different shift amounts may be processed in parallel during a single clock cycle of the decoder 152 using multiple barrel shifters and multiple syndrome update circuits, as described in further detail with regard to FIGS. 3-5.

The hard decision change detector circuit 210 receives hard decision bit values for bit 0 through bit Z–1 for iteration l (e.g., a "current" decoding iteration) and for iteration l–1 (e.g., a "preceding" decoding iteration). For example, the decoder 152 may have a partial-parallel architecture that performs a variable-node-to-check-node update operation using the hard decision bit values from $r_0$ to $r_{Z-1}$ from the $(l-1)^{th}$ decoding iteration, followed by a check-node-to-variable-node update operation that updates values of the hard decision bits $r_0$ to $r_{Z-1}$ and associated reliabilities for the lth decoding iteration. The hard decision bits $r_0$ to $r_{Z-1}$ for the $l^{th}$ decoding iteration and for the $(l-1)^{th}$ decoding iteration may be provided to the hard decision change detector circuit 210 to be shifted and used for updating the corresponding syndromes "on-the-fly."

As used herein, a syndrome value or syndrome weight is generated "on-the-fly" when the value is generated during a same clock cycle (or after a delay of one or more clock cycles, such as in a pipelined architecture) as generation of a portion of the hard decision bit values (e.g., hard decision bit values $r_0$ to $r_{Z-1}$) without first waiting to complete generation of all updated hard decision bit values for the decoding iteration. To illustrate, hard bit decisions $r_0$ . . . $r_{4096}$ may be updated in 410 clock cycles (e.g., when Z=10) of a single decoding iteration. After each clock cycle of the decoding iteration, the 10 hard decision bits that are updated during the clock cycle may be used to update syndrome values or syndrome weight values on-the-fly, without waiting for all 4,096 hard decision bits to be updated.

The hard decision change detector circuit 210 outputs the hard decision bit data 161. Each bit of the hard decision bit data 161 in the $l^{th}$ iteration indicates whether the corresponding bit of the hard decision bit values has changed since the $(l-1)^{th}$ iteration. For example, $hb_1$ having a "1" value indicates $r_1^{(l)}$ is not equal to $r_1^{(l-1)}$. Each bit of the hard decision bit data 161 having a "1" value indicates that a corresponding syndrome changes value.

The hard decision bit data 161 is processed by the first barrel shifter 156 to generate the shifted data 163. The shifted data 163 corresponds to the hard decision bit data 161 that has been circularly shifted by the shift amount k. The shifted data 163 is output by the last tier 222 of multiplexors and input to the first syndrome update circuit 158.

Each of the syndromes $s_0$ through $s_{Z-1}$ of the set of syndromes 165 is XORed with the corresponding bit of the shifted data 163 to generate updated syndromes $s^*_0$ through $s^*_{Z-1}$ of the updated set of syndromes 167. For example, the set of syndromes 165 may be read from one or more registers in the syndrome storage 154 and the set of updated syndromes 167 may be written to the one or more registers in the syndrome storage 154. Each of the syndromes may be represented as a single bit in binary LDPC implementations (e.g., each code symbol and each syndrome has a binary value, such as a "0" or "1") or as multiple bits in non-binary LDPC implementations (e.g., each code symbol and each syndrome has a multi-bit value).

Although the set of syndromes output from the first syndrome update circuit 158 is described as an "updated" set of syndromes 167, it should be understood that the updated set of syndromes 167 may match the set of syndromes 165 without any bits differing between the set of syndromes 165 and the updated set of syndromes 167. To illustrate, if the shifted data 163 is all-zeros during a particular clock cycle (e.g., none of the Z hard decision bits from $r_0$ to $r_{Z-1}$ changed values between iteration (l–1) and iteration l), no syndromes will change values in the first syndrome update circuit 158 during that clock cycle.

Although the hard decision bit data output from the first barrel shifter 156 is described as "shifted" data 163, it should be understood that the shifted data 163 may not be bit-shifted relative to the hard decision bit data 161. For example, if the shift amount k is zero during a particular clock cycle, no bit shift is performed by the first barrel shifter 156 during that clock cycle.

FIG. 3 depicts an illustrative example of components 300 that may be included in the decoder 152 of FIG. 1. One or more components of FIG. 3 may be as described with reference to FIG. 1, FIG. 2, or both. For example, the components 300 may include the syndrome storage 154, the first barrel shifter 156, the first syndrome update circuit 158, and the hard decision change detector circuit 210.

The components 300 may include multiple barrel shifters 302. For example, the multiple barrel shifters 302 may include the first barrel shifter 156, a second barrel shifter 304, and a third barrel shifter 308. The components 300 may further include multiple sets of multiplexors, such as a first set of multiplexors 312 and a second set of multiplexors 316.

The hard decision change detector circuit 210 may be coupled to the first barrel shifter 156, the second barrel shifter 304, and the third barrel shifter 308. The hard decision change detector circuit 210 may be further coupled to a syndrome update unit 314 that includes the first syndrome update circuit 158. FIG. 3 further illustrates that the syndrome update unit 314 may be coupled to the second set of multiplexors 316, and the second set of multiplexors 316 may be coupled to the syndrome storage 154. FIG. 3 also depicts that the syndrome storage 154 may be coupled to first set of multiplexors 312 and that the first set of multiplexors 312 may be coupled to the first syndrome update circuit 158.

During a decoding process, the first set of multiplexors 312 may be configured to route sets of syndromes from the syndrome storage 154 to syndrome update circuits, such as the first syndrome update circuit 158, within the syndrome update unit 314. As described further with regard to FIGS. 4-5, the syndrome update unit 314 may include multiple syndrome update units that may operate in parallel. The second set of multiplexors 316 may be configured to route updated versions of the sets of syndromes from the syndrome update circuits (e.g., the first syndrome update circuit 158) to the syndrome storage 154. The first syndrome update circuit 158 may output a syndrome weight (SW), which may indicate a number of parity check equations that are unsatisfied according to the hard decision bits that have been computed.

The example of FIG. 3 may reduce circuit size and complexity of a decoder in some cases. For example, a "critical path" of the decoder 152 may be reduced as compared to conventional decoders because two sets of barrel shifters of conventional decoders are omitted from the data path from an output of the syndrome storage 154 to an input of the syndrome storage 154.

FIG. 4 depicts an illustrative example of components 400 that may be included in the decoder 152 of FIG. 1, such as included in the syndrome update unit 314 of FIG. 3. The components 400 may include multiple syndrome update circuits 402, such as the first syndrome update circuit 158 and a second syndrome update circuit 404.

The multiple syndrome update circuits 402 may have inputs coupled to outputs of the multiple barrel shifters 302 of FIG. 3. For example, in an illustrative implementation that includes a first number of the multiple barrel shifters 302 of FIG. 3 and that also includes a second number of the multiple syndrome update circuits 402, the second number equals the first number (e.g., the first number and the second number may be equal to d).

The components 400 may also include a syndrome weight update circuit 403. The syndrome weight update circuit 403 may be coupled to the first syndrome update circuit 158 and to the second syndrome update circuit 404. The syndrome weight update circuit 403 may be configured to perform calculations in accordance with Table 4, as described in further detail below.

The syndrome weight update circuit 403 may include adding circuitry 408 coupled to each of the multiple syndrome update circuits 402. For example, the adding circuitry 408 may include multiple summers coupled to the syndrome update circuits 402. To illustrate, FIG. 4 depicts that the multiple summers may include a first summer 412 coupled to the first syndrome update circuit 158 and may further include a second summer 416 coupled to the second syndrome update circuit 404. The adding circuitry 408 may also include an adder tree 418 coupled to outputs of the multiple summers. For example, FIG. 4 depicts that the adder tree 418 may be coupled to a first output of the first summer 412 and may also be coupled to a second output of the second summer 416. The adder tree 418 may include d inputs and may generate an output value corresponding to count of Table 4.

The syndrome weight update circuit 403 may further include a computation circuit 422. The computation circuit 422 may be coupled to the adding circuitry 408. The syndrome weight update circuit 403 may also include a syndrome weight register 426 coupled to the computation circuit 422 and hard bit circuitry 430 coupled to the computation circuit 422. The hard bit circuitry 430 is configured to generate a value corresponding to d multiplied by the number of hard bit value changes relative to the previous iteration, expressed as $d\Sigma_j(r_j^{(l)} \oplus r_j^{(l-1)})$ in Table 4.

In operation during a decoding process, the adding circuitry 408 may be configured to determine a number of syndromes (e.g., the set of syndromes 165 of FIG. 1) that change from "1" to "0" in a clock cycle (e.g., a clock cycle of the decoder 152 of FIG. 1). The computation circuit 422 may be configured to determine an updated syndrome weight value based on the number of the syndromes that change and based on a syndrome weight value at the beginning of the clock cycle. The computation circuit 422 may be configured to determine the updated syndrome weight value further based on a count of hard decision bits that have changed values (e.g., the hard decision bit data 161 or 163 of FIG. 1 as non-limiting examples) that is received from the hard bit circuitry 430. For example, the hard bit circuitry 430 may be responsive to the hard decision bit data 161 to determine the count of hard decision bits that have changed values.

To further illustrate, each of the multiple syndrome update circuits 402 may update a set of syndromes associated with one nonzero submatrix. Each summer of FIG. 4 may receive Z input bits and may determine a number of "1" bits of the Z input bits. The d summers coupled to the adder tree 418 (e.g., the summers 412, 416 in the example of FIG. 4) may generate d sets of bits at the d inputs of the adder tree 418, and the adder tree 418 may be configured to add the d sets of bits to generate the count value indicated in Table 4. In this example, the adder tree 418 may provide an indication of the count value to the computation circuit 422.

The computation circuit 422 may be configured to multiply the count value by a factor (e.g., a factor of two) after the adding circuitry 408 adds the "1" bits in the d sets of Z input bits (as compared to multiplication by two prior to an adder tree in certain conventional LDPC decoders). The reduced size of the summers of FIG. 4 may at least partially offset the additional area used by the summers for the XORed hard decision bits (which may not be included in conventional LDPC decoders).

The example of FIG. 4 may enable real-time syndrome weight updating at a decoder, such as the decoder 152 of FIG. 1. For example, by bit-shifting hard-decision bits instead of syndromes (e.g., using the syndrome weight updating as expressed in Table 4), barrel shifters are also removed from the "critical path" of a decoder, which may reduce a number of clock cycles of the decoder used to update syndrome weights.

FIG. 4 illustrates an example in which the syndrome weight update circuit 403 is not pipelined. In other implementations, the syndrome weight update circuit 403 is pipelined, such as described with reference to FIG. 5.

FIG. 5 depicts an illustrative example of components 500 that may be included in the decoder 152 of FIG. 1, such as components of the syndrome update unit 314 of FIG. 3. The components 500 may include the multiple syndrome update circuits 402 and the syndrome weight update circuit 403. The syndrome weight update circuit 403 may include the adding circuitry 408, the computation circuit 422, the syndrome weight register 426, and the hard bit circuitry 430 described with reference to FIG. 4.

FIG. 5 depicts that one or more of the first summer 412, the second summer 416, or the adder tree 418 may have a pipelined configuration. For example, the first summer 412 may include a first portion 504, a pipeline register 508 coupled to the first portion 504, and a second portion 512 coupled to the pipeline register 508. As another example, the second summer 416 may include a first portion 516, a pipeline register 520 coupled to the first portion 516, and a second portion 524 coupled to the pipeline register 520. As an additional example, the adder tree 418 may include a first portion 528, a pipeline register 532 coupled to the first portion 528, and a second portion 536 coupled to the pipeline register 532. The hard bit circuitry 430 may also include one or more pipeline registers, such as illustrative registers 540 and 542, so that a number of pipeline stages in the hard bit circuitry 430 matches a number of pipeline stages in the adding circuitry 408.

During operation, the syndrome weight update circuit 403 may operate according to a pipelined processing technique. The pipelined processing technique may be associated with a delay of one or more clock cycles during updating of syndrome weight values as compared to operation of the components 400 of FIG. 4. To illustrate, in the example of FIG. 5, the pipeline registers 508, 520 may be associated with a clock cycle, and the pipeline register 532 may be associated with another clock cycle.

In some applications, the pipelined processing technique may enable certain benefits of pipeline processing. For example, the pipelined processing technique may reduce the amount of sequential logical operations that are performed in each clock cycle, enabling a higher clock frequency. The pipelined processing implementation illustrated in FIG. 5 may be suitable in certain applications in which latency of syndrome weight updating is acceptable (e.g., if another device component functions as a processing "bottleneck" of the device).

Figure 6:
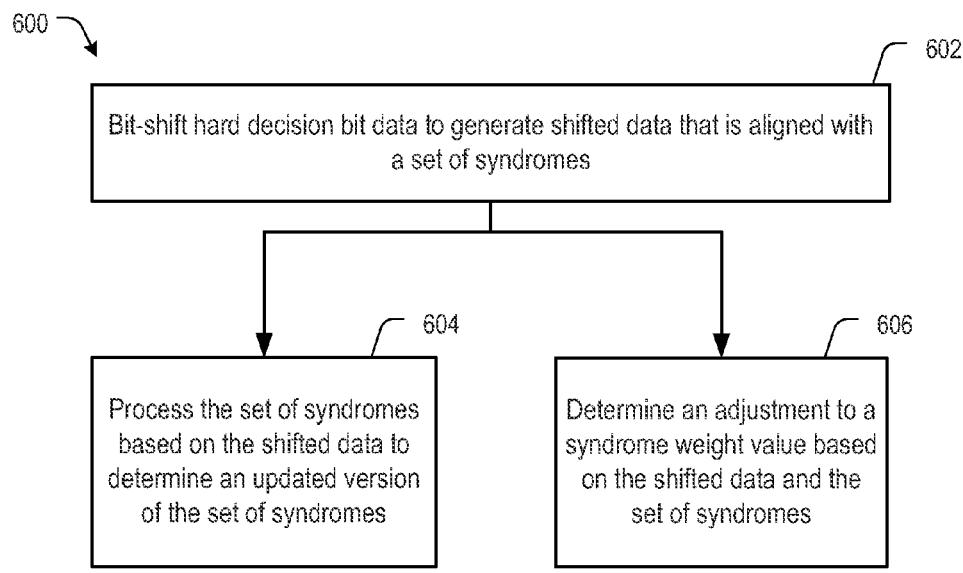
FIG. 6 is a flow chart of a particular illustrative embodiment of a method of decoding data that may be performed at the decoder of FIG. 1.

Referring to FIG. 6, a particular embodiment of a method 600 is depicted. The method 600 may be performed at a data storage device that includes a low-density parity check (LDPC) decoder, such as the data storage device 102 of FIG. 1. The method 600 may be performed during a clock cycle of the LDPC decoder.

Hard decision bit data is bit-shifted to generate shifted data that is aligned with a set of syndromes, at 602. For example, the hard decision bit data 161 may be bit-shifted to generate the shifted data 163 that is aligned with the set of syndromes 165 from the syndrome storage 154.

The set of syndromes is processed based on the shifted data to determine an updated version of the set of syndromes, at 604. For example, the set of syndromes 165 may be processed (e.g., based on the shifted data 163) to generate the updated version of the set of syndromes 167.

An adjustment to a syndrome weight value may be determined based on the shifted data and the set of syndromes, at 606. For example, the computation circuit 422 may be configured to determine an updated syndrome weight value based on the number of the syndromes that change and based on a syndrome weight value at the beginning of a clock cycle and to determine the updated syndrome weight value further based on the hard decision bit data 161 that have changed values. In this example, determining the adjustment to the syndrome weight value may include determining a number of syndromes that change from a first value to a second value during the clock cycle and may also include determining a number of hard decision bits that have changed. To further illustrate, determining the adjustment to the syndrome weight value may include subtracting, from a multiple of the number of hard decision bits that have changed, twice the number of syndromes that change from the first value to the second value during the clock cycle.

Determining the adjustment to the syndrome weight value (at 606) may be performed at least partially in parallel with determining the updated version of the set of syndromes (at 604). For example, the adjustment to the syndrome weight value may be determined in the same clock cycle that the updated version of the set of syndromes is determined, such as in FIG. 4. Alternatively, determining the adjustment to the syndrome weight value may be pipelined over multiple clock cycles, and the updated version of the set of syndromes may be determined during one or more of the multiple clock cycles, such as in FIG. 5. In other implementations, determining the adjustment to the syndrome weight value may be performed after (e.g., in a clock cycle following) determining the updated version of the set of syndromes.

In an illustrative implementation, the set of syndromes is retrieved from a syndrome storage without bit-shifting the set of syndromes. For example, use of the first barrel shifter 156 may enable the hard decision bit data 161 to be bit-shifted instead of bit-shifting of the set of syndromes 165. In this case, the set of syndromes 165 may be retrieved from the syndrome storage 154 and provided to the syndrome update circuit 158 without bit-shifting the set of syndromes 165. In some applications, retrieving the syndromes without bit-shifting the set of syndromes may reduce a number of barrel shifters of a device (e.g., from two barrel shifters to one barrel shifter, as an illustrative example), which may reduce device complexity and cost.

In conjunction with one or more of the embodiments described with reference to FIGS. 1-6, an apparatus includes means for storing (e.g., the syndrome storage 154) syndromes, such as the set of syndromes 165. The apparatus further includes means for bit-shifting (e.g., one or more of the barrel shifters 156, 304, and 308) hard decision bit data (e.g., the hard decision bit data 161) to generate shifted data (e.g., the shifted data 163) that is aligned with a set of syndromes (e.g., the set of syndromes 165) from the means for storing. The apparatus further includes means for generating (e.g., the syndrome update circuit 158, the syndrome update unit 314, or one or more of the syndrome update circuits 402) an updated version of the set of syndromes (e.g., the updated set of syndromes 167) based on the shifted data and the set of syndromes.

The apparatus may further include means for updating (e.g., syndrome weight update circuit 403) a syndrome weight based on the shifted data and the set of syndromes.

In some implementations, the means for updating a syndrome weight is pipelined, such as described with reference to the syndrome weight update circuit 403 in the example of FIG. 5. In other implementations, the means for updating a syndrome weight is not pipelined, such as described with reference to the syndrome weight update circuit 403 in the example of FIG. 4.

The memory device 103 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory device 103 may include another type of memory. In a particular embodiment, the data storage device 102 is indirectly coupled to an accessing device (e.g., the accessing device 170) via a network. For example, the data storage device 102 may be a network-attached storage (NAS) device or a component (e.g., a solid-state drive (SSD) component) of a data center storage system, an enterprise storage system, or a storage area network. The memory device 103 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), magnetoresistive random access memory ("MRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A data storage device comprising:
a non-volatile memory; and
a controller coupled to the non-volatile memory and including a decoder configured to perform a decoding operation using codeword data read from the non-volatile memory,
wherein the decoder includes:
  syndrome storage;
  multiple barrel shifters including a first barrel shifter configured to bit-shift hard decision bit data to generate shifted data that is aligned with a set of syndromes from the syndrome storage;
  multiple syndrome update circuits including a first syndrome update circuit coupled to the first barrel shifter and configured to process the set of syndromes based on the shifted data to generate an updated version of the set of syndromes;
  a first set of multiplexors configured to route sets of syndromes from the syndrome storage to the syndrome update circuits; and
  a second set of multiplexors configured to route updated versions of the sets of syndromes from the syndrome update circuits to the syndrome storage.

2. The data storage device of claim 1, wherein the decoder further includes a syndrome weight update circuit coupled to the first syndrome update circuit.

3. The data storage device of claim 2, wherein the syndrome weight update circuit includes adding circuitry coupled to each of the syndrome update circuits, the adding circuitry configured to determine a number of the syndromes that change from an initial value in a clock cycle of the decoder.

4. The data storage device of claim 3, wherein the adding circuitry includes:
  multiple summers coupled to the syndrome update circuits; and
  an adder tree coupled to outputs of the summers.

5. The data storage device of claim 3, wherein the decoder further includes:
  a computation circuit coupled to the adding circuitry; and
  a syndrome weight register coupled to the computation circuit, the computation circuit configured to determine an updated syndrome weight value based on the number of the syndromes that change and based on a syndrome weight value at the beginning of the clock cycle.

6. The data storage device of claim 5, wherein the computation circuit is further configured to determine the updated syndrome weight value further based on a count of hard decision bits that have changed values.

7. The data storage device of claim 2, wherein the syndrome weight update circuit includes first circuitry coupled to an input of a pipeline register and second circuitry coupled to an output of the pipeline register.

8. The data storage device of claim 1, wherein:
  the decoder includes a first number of the barrel shifters,
  the decoder includes a second number of the syndrome update circuits, and wherein
  the second number equals the first number.

9. A data storage device comprising:
a non-volatile memory; and
a controller coupled to the non-volatile memory and including a decoder configured to perform a decoding operation using codeword data read from the non-volatile memory,
wherein the decoder includes:
  syndrome storage;
  multiple barrel shifters including a first barrel shifter configured to bit-shift hard decision bit data to generate shifted data that is aligned with a set of syndromes from the syndrome storage;
  multiple syndrome update circuits including a first syndrome update circuit coupled to the first barrel shifter and configured to process the set of syndromes based on the shifted data to generate an updated version of the set of syndromes; and
  a syndrome weight update circuit including adding circuitry coupled to each of the syndrome update circuits, the adding circuitry configured to determine, for a clock cycle of the decoder, a number of the syndromes that change value during the clock cycle.

10. The data storage device of claim 9, wherein:
the decoder includes a first number of the barrel shifters,
the decoder includes a second number of the syndrome update circuits, and
the second number equals the first number.

11. The data storage device of claim 9, wherein the adding circuitry includes:
multiple summers coupled to the syndrome update circuits; and
an adder tree coupled to outputs of the summers.

12. The data storage device of claim 9, wherein:
the decoder further includes:
a computation circuit coupled to the adding circuitry; and
a syndrome weight register coupled to the computation circuit, and
the computation circuit is configured to determine an updated syndrome weight value based on the number and based on a syndrome weight value corresponding to the beginning of the clock cycle.

13. The data storage device of claim 12, wherein the computation circuit is further configured to determine the updated syndrome weight value further based on a count of hard decision bits that change value during the clock cycle.

14. The data storage device of claim 9, wherein the decoder further includes:
a first set of multiplexors configured to route sets of syndromes from the syndrome storage to the syndrome update circuits; and
a second set of multiplexors configured to route updated versions of the sets of syndromes from the syndrome update circuits to the syndrome storage.

15. The data storage device of claim 9, wherein the syndrome weight update circuit further includes:
first circuitry coupled to an input of a pipeline register; and
second circuitry coupled to an output of the pipeline register.

16. An apparatus comprising:
means for non-volatile storage; and
means for controlling the means for non-volatile storage, the means for controlling including means for decoding using codeword data read from the means for non-volatile storage,
wherein the means for decoding includes:
means for syndrome storage;
multiple means for barrel shifting including a first means for barrel shifting configured to bit-shift hard decision bit data to generate shifted data that is aligned with a set of syndromes from the means for syndrome storage;
multiple means for syndrome updating including a first means for syndrome updating configured to process the set of syndromes based on the shifted data to generate an updated version of the set of syndromes, the first means for syndrome updating coupled to the first means for barrel shifting; and
means for updating a syndrome weight including means for adding coupled to each of the means for syndrome updating, the means for adding configured to determine, for a clock cycle of the means for decoding, a number of the syndromes that change value during the clock cycle.

17. The apparatus of claim 16, wherein:
the means for decoding includes a first number of the means for barrel shifting,
the means for decoding includes a second number of the means for syndrome updating, and
the second number equals the first number.

18. The apparatus of claim 16, wherein the means for adding includes:
multiple means for summing coupled to the multiple means for syndrome updating; and
means for adding using a tree structure, the means for adding coupled to outputs of the multiple means for summing.

19. The apparatus of claim 16, wherein the means for decoding further includes means for determining an updated syndrome weight value based on the number of the syndromes that change and based on a syndrome weight value at the beginning of the clock cycle.

20. The apparatus of claim 16, wherein the means for decoding further includes:
a first set of means for multiplexing configured to route sets of syndromes from the means for syndrome storage to the multiple means for syndrome updating; and
a second set of means for multiplexing configured to route updated versions of the sets of syndromes from the multiple means for syndrome updating to the means for syndrome storage.

* * * * *